(12) United States Patent
Hampel et al.

(10) Patent No.: US 6,542,416 B1
(45) Date of Patent: Apr. 1, 2003

(54) METHODS AND ARRANGEMENTS FOR CONDITIONALLY ENFORCING CAS LATENCIES IN MEMORY DEVICES

(75) Inventors: Craig E. Hampel, San Jose, CA (US); Frederick A. Ware, Los Altos, CA (US); Richard E. Warmke, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 10/001,030

(22) Filed: Nov. 2, 2001

(51) Int. Cl.[7] .................................................. G11C 7/00
(52) U.S. Cl. ..................... 365/194; 365/233; 365/233.5
(58) Field of Search .................................. 365/194, 233, 365/233.5, 230.08, 189.12, 236, 191

(56) References Cited

U.S. PATENT DOCUMENTS

| | | | |
|---|---|---|---|
| 5,917,761 A | * | 6/1999 | Tietjen et al. ................ 365/194 |
| 6,075,730 A | * | 6/2000 | Barth et al. .................. 365/191 |
| 6,101,152 A | | 8/2000 | Farmwald et al. |

OTHER PUBLICATIONS

B. Davis, T. Mudge, B. Jacob, V. Cuppu, "DDR2 and Low Latency Variants," date unknown, pp. 1–15.

* cited by examiner

*Primary Examiner*—David Lam
(74) *Attorney, Agent, or Firm*—Lee & Hayes, PLLC

(57) ABSTRACT

Methods and arrangements are provided for use in memory devices, which allow column address strobe (CAS) timing to adjust to, and/or be adjusted by a controller to, have both minimal unloaded latency and optimal pipelined latency. A delay CAS (DC) period is only applied until a row-to-column delay (tRCD) has been satisfied. Once the tRCD has been satisfied, then the DC period is not enforced for subsequent CAS operations within the memory core associated with a page hit. When a subsequent read command is received at the input/output pins of the memory device and a corresponding RAS operation is performed in the memory core, then the tRCD will again need to be satisfied and a DC period will again be enforced. Consequently the methods and arrangements allow the CAS delay to be dynamically and selectively adjusted to best support the workload. This results in better performance and increased bandwidth.

38 Claims, 3 Drawing Sheets

METHODS AND ARRANGEMENTS FOR CONDITIONALLY ENFORCING CAS LATENCIES IN MEMORY DEVICES

TECHNICAL FIELD

The present invention is directed to memory devices, and more particularly to methods and arrangements that provide improved control over certain memory device latencies associated with read and/or write operations.

BACKGROUND

Memory devices, such as, dynamic random access memory (DRAM), synchronous DRAM (SDRAM), and the like, include at least one integrated circuit that is configured to store information in the form of binary data. In certain exemplary memory devices, at least one memory core is provided. The memory core has a plurality of memory cells operatively arranged as an array, such that the memory cells are associated with an addressable row and column. In this manner, data can be read from selected memory cells, and written to selected memory cells. Memory cells essentially act as capacitors that are charged/discharged as required to store an applicable binary value.

During a read operation, for example, an activate (row) command selectively causes the data in memory cells associated with a row to be loaded into a plurality of sense amplifiers (sense amps). Subsequently, a column (read) command is applied, which causes the data loaded into the sense amps to be asserted onto a data bus that can then be read by another circuit.

However, the sense amps require a certain amount of time to evaluate the memory cells following an activate (row) command. Thus, the application of the column (read) command needs to be timed or delayed accordingly. This delay is typically specified by a row-to-column delay (tRCD) in conventional DRAMs. There is also an inherent latency from the issuance of a read command until the corresponding data is available on the data bus.

To account for such delays/latency, a programmable column address strobe (CAS) latency can be enforced. For example, in certain conventional SDRAMs, this value is programmed as a CAS latency (CL) value in a mode register of the SDRAM. This programmability allows for latency minimization and yield enhancement.

The number of clocks cycles that must be allowed for the read to occur in a synchronous memory device system, is a function of the DRAM's core response time, and the frequency of the clock signal being applied. In order to have minimal latency at any clock frequency, a register is often provided, to allow the number of clocks cycles between the read command and the data availability to be optimized. Additionally, not all memory devices will have the same minimum latency. Usually, in production, there will be a distribution of the minimum latency a DRAM core can achieve. By allowing the register to be programmed after the device has been tested, latency can be minimized over the yield distribution of the memory device.

These solutions introduce a dilemma during the memory device controller design phase. Here, a controller design must either optimize for pipeline efficiency under load, or unloaded latency when the pipeline is empty. Consequently, the CAS timing cannot be optimized to the applied workload. For example, the option of changing the register value to adjust for the applied workload will not work, since the task of writing to the register takes much longer than the read operation itself. Moreover, the applied workload tends to change much more quickly than the register can.

Thus, there is a need for improved methods and arrangements that allow for the timing of commands and corresponding operations to better support the applied workload. Preferably, the improved methods and arrangements can be used to alter CAS timing to provide substantially minimal unloaded latency when needed and substantially optimal pipelined latency when needed.

BRIEF DESCRIPTION OF THE DRAWINGS

A more complete understanding of the various methods and arrangements of the present invention may be had by reference to the following detailed description when taken in conjunction with the accompanying drawings wherein.

DETAILED DESCRIPTION

While the following exemplary implementations are directed towards a read operation, it should be understood that the various methods and arrangements are also suitable for use with write operations. Those skilled in the art will also recognize that the various methods and arrangements can be used with different types of memory devices and are not limited to memory systems that include SDRAM.

With this in mind, in accordance with certain aspects of the present invention, methods and arrangements are provided that allow the CAS latency to be dynamically adjusted and optimized to better support the applied workload.

In certain conventional SDRAMs, an additive latency is provided to delay the read command to the core before beginning the access to the core. Using this mechanism, the controller can send the read command when convenient on the control bus, and enforce the tRCD delay. Unfortunately, for a page hit the additive latency is still applied even if the tRCD delay has already expired.

In accordance with the methods and arrangements provide herein, such an additive delay is only applied until the tRCD has been satisfied. Once the tRCD has been satisfied (i.e., expired), then the additive delay can be removed for subsequent CAS operations associated with the page hit. Thereafter, when a subsequent read command is received and a corresponding RAS operation is performed, then the tRCD will again need to be satisfied and the additive delay enforced. As such, the methods and arrangements allow the CAS delay to be dynamically and selectively adjusted to best support the workload. This results in better performance and increased bandwidth. Previously, conventional systems had to compromise between latency and bandwidth. Here, however, such a compromise can now be avoided.

Figure 1:
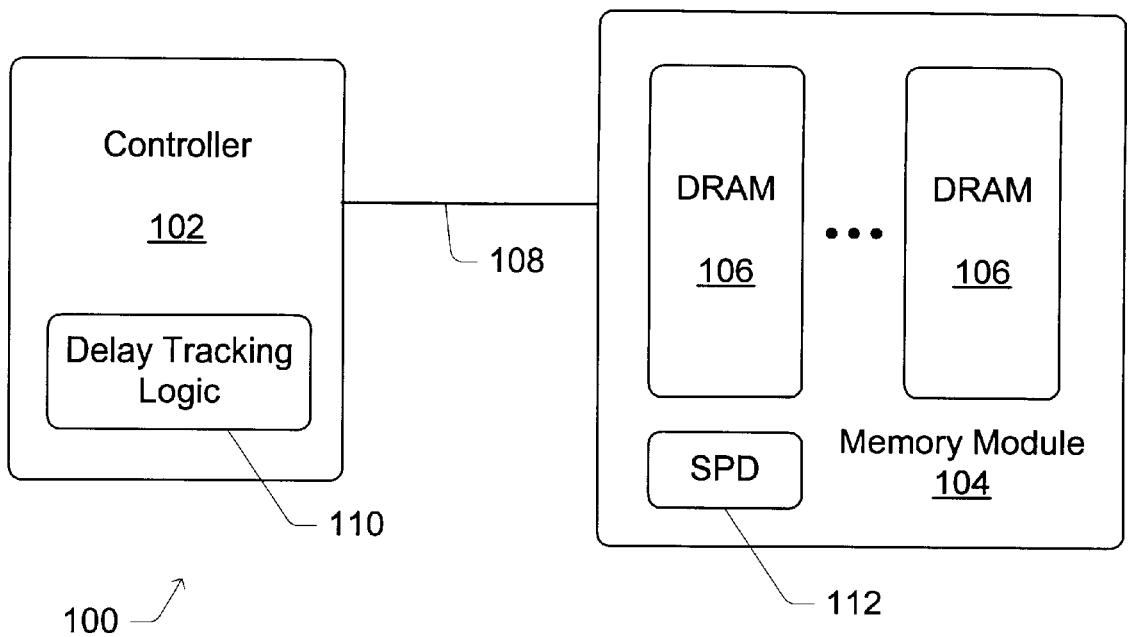
FIG. 1 is a block diagram depicting a memory system having at least one DRAM, in accordance with certain exemplary implementations of the present invention.

Reference is now made to FIG. 1, which depicts certain portions of a memory device 100, including a controller 102 and a memory module 104, which are coupled together via at least one bus 108. Controller 102 is responsive to read and write requests from one or more other devices (not shown) or may generate the requests locally as is the case with a CPU. In a computer system, for example, memory device 100 may include a plurality of memory modules 104. As used herein, the term "module" is not meant to limit the variety of other configurations/forms that the memory device can take.

Controller 102, which, for example, may include dedicated logic, a CPU, a Gfx engine, or the like, responds to a read (or write) request by generating applicable read (or write) command(s), which are provided to memory module 104 over bus 108. These commands are selectively provided to DRAMs 106 within memory module 104. DRAMs 106 are each configured to respond to the read (or write) commands, accordingly. A read operation results in the selected data being output by DRAMs 106 onto bus 108. A write operation results in the data on the bus 108 being stored in the DRAMs 106.

As shown in FIG. 1, memory module 104 includes a serial present detect (SPD) EPROM 112, or other like storage mechanism, from which the tRCD value can be read. Such arrangements are well known.

Controller 102 is further depicted as having delay tracking logic 110. Essentially, delay tracking logic 110 is configured to allow controller 102 to determine when data from a read operation is available on bus 108, or when to apply data to bus 108 during a write operation. To perform this task, delay tracking logic 110 needs to understand, track, and/or otherwise measure, the CAS latency associated with a given operation (e.g., whether the tRCD has been satisfied, and what additive delay if any w ill be applied). Delay tracking logic 110 can, for example, take the form of a counter or similar logic that measures the appropriate latency/delays to account for the conditional enforcement of a tRCD and CAS latency (CL). Similar exemplary counting mechanisms/techniques are described in greater detail below with regard to conditional delay logic within a DRAM.

Figure 2:
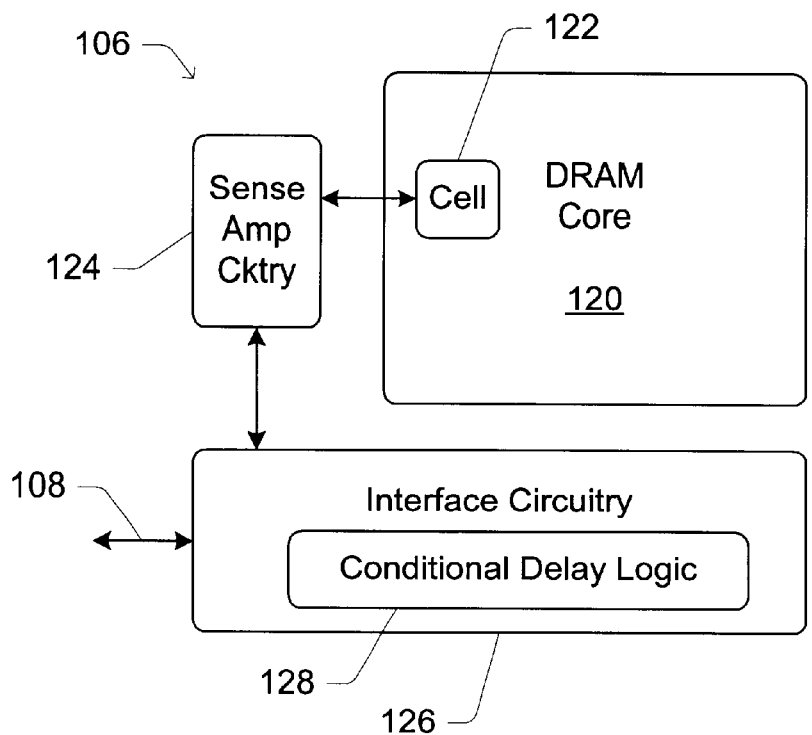
FIG. 2 is a block diagram depicting a DRAM, for example, as in FIG. 1, having conditional delay logic therein, in accordance with certain exemplary implementations of the present invention.

Turning next to FIG. 2, portions of an exemplary DRAM 106 are depicted. Here, DRAM 106 includes a DRAM core 120 having a plurality of memory cells 122 therein. DRAM core 106 is coupled to sense amp circuitry 124, which is further coupled to interface circuitry 126. Interface circuitry 126 is further coupled to at least one bus 108 and configured to send/receive control, address and/or data, as needed, there over.

In this example, conditional delay logic 128 is operatively configured within interface circuitry 126. Conditional delay logic 128 is configured to conditionally enforce a defined delay CAS (DC) period.

Figure 3A:
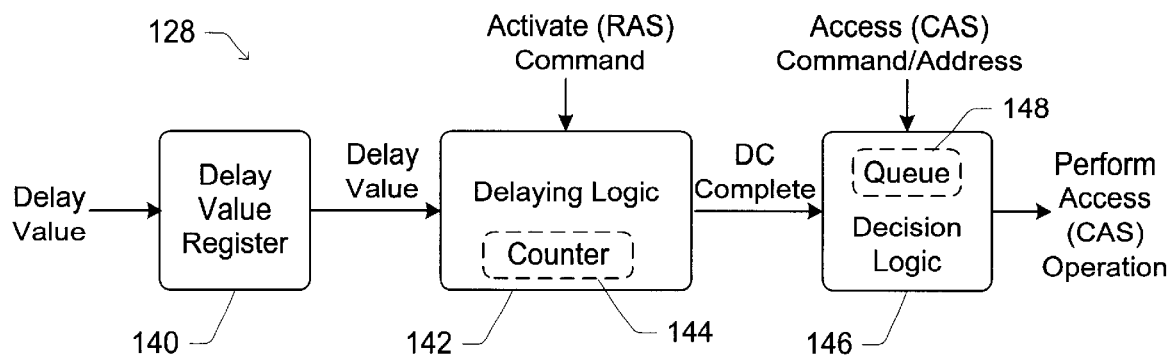
FIG. 3a is a block diagram depicting functions associated with conditional delay logic, for example, as in FIG. 2, in accordance with certain exemplary implementations of the present invention.

FIG. 3a depicts an exemplary implementation of conditional delay logic 128. Here, a delay value is programmably provided to a delay value register 140. Delay value register 140 is configured to store the delay value, which defines the DC period to be conditionally enforced. In accordance with certain preferred implementations of the present invention, the delay value is generated by controller 102 (FIG. 1) and provided to delay value register 140 via bus 108. Preferably, the delay value is based on the tRCD value in SPD 112. For example in certain implementations of the present invention, a DC period can be calculated as follows:

$$DC=(tRCD/\text{clock\_cylce\_time})-1$$

The delay value is then provided to delaying logic 142, which also receives an activate (RAS) command. Upon receipt of an activate command, delaying logic 142 is configured to measure, time, or otherwise determine, when the DC period (per the defined delay value), has ended. By way of example, delaying logic 142 may include a counter 144 that either counts clock signal events up to the defined delay value, or alternatively counts clock signal events down from the defined delay value.

Once the delay period has ended, delaying logic 142 provides a DC completed signal to decision logic 146. Decision logic 146 also receives and stores the access (CAS) command. For example, a queue mechanism 148 can be implemented to store the received CAS information (control/address). In this example, decision logic 146 is configured to hold the CAS information until the DC completed signal is asserted/received from delaying logic 142. If the DC completed signal is asserted, then decision logic 146 will release the CAS information to initiate the CAS operation within the core.

Figure 3B:
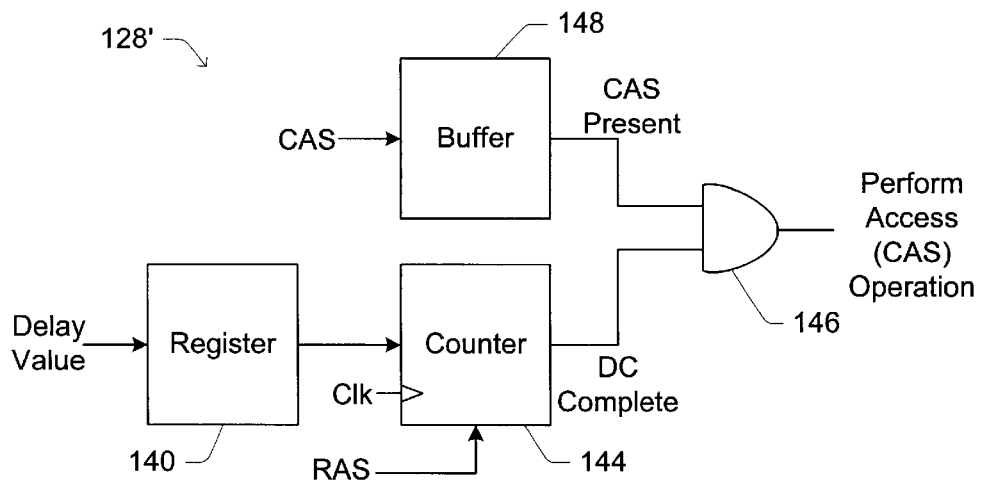
FIG. 3b is a block diagram depicting functions associated with conditional delay logic, for example, as in FIG. 2, in accordance with certain further exemplary implementations of the present invention.

FIG. 3b depicts a similar exemplary implementation in conditional delay logic 128'. Here, delaying logic 144 is a down counter that reads the delay value stored in register 140 upon receipt of a RAS signal (e.g., at the input pins of the memory device). The counter then proceeds to count down from the delay value based on the clock cycles associated with the clock input. When the counter reaches zero, a logical DC completed signal is asserted. In this example, queue 148 includes a buffer that provides a logical CAS present signal to decision logic 146, which includes an AND gate. The output of the AND gate identifies to other logic (not shown) that the CAS operation within the core can begin.

Upon receipt of a second subsequent CAS signal to buffer 148, a corresponding CAS operation will be performed within the core without additional delay provided that the DC completed signal is still being asserted by counter 144 (i.e., no further RAS signal has been received since the previous one). Should counter 144 receive a subsequent RAS signal, then the DC completed signal would be de-asserted and counter 144 would begin counting down once again so as to enforce the defined DC period on the CAS operation associated with the RAS operation.

Hence, as shown a counter can be applied that counts from the activate command and delays the read (or write) operation to the core until the value indicated in the delay value register expires. In this case the delay would only occur when the column command is to the same device and bank, and the tRCD value has not expired. For a page hit operation, the tRCD delay, and the counter would have expired, and no additional latency would be added.

It is noted, that if a DRAM has multiple banks, then more than one set of delay logic 142 may be needed to enforce the tRCD value on a per bank basis.

Those skilled in the art will recognize that conditional delay logic 128/128' can be implemented in a variety of ways and with different logic/circuitry. Furthermore, similar conditional delay logic can be used for write operations. For example, the delay period can be used to allow a write command to be sent early. Here, the corresponding CAS operation would not be conducted until the delaying logic asserts the DC completed signal. It is noted, that the delay period for a write operation, between the command receipt and the data available, may be different than the delay period associated with a read operation.

Figure 4A:
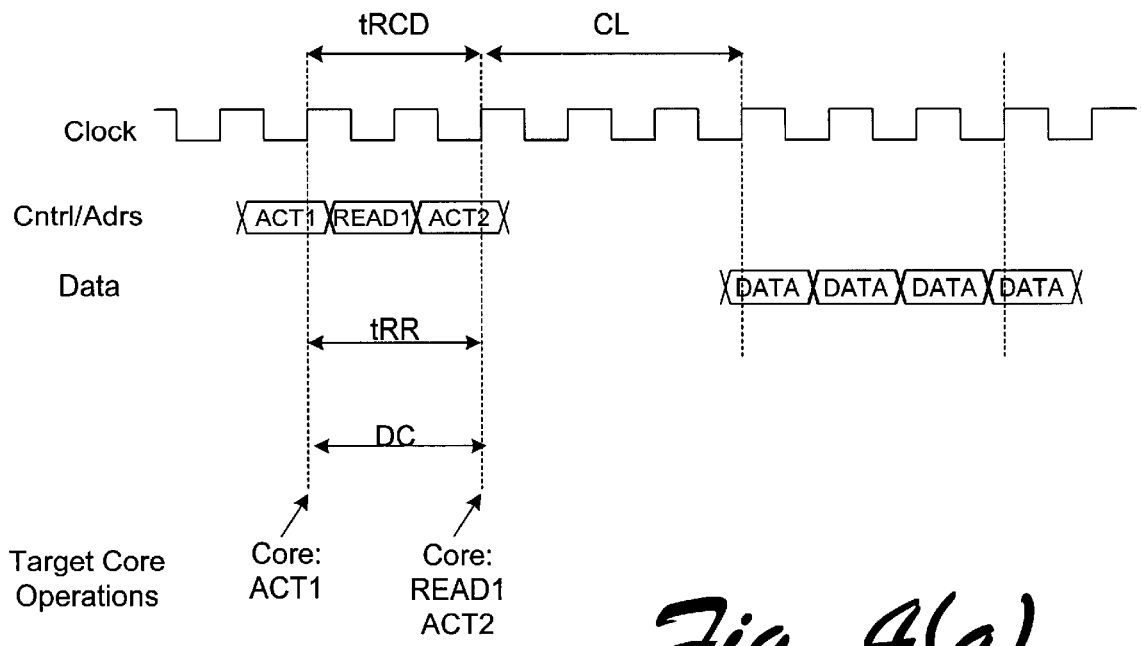
FIG. 4a is a timeline graph illustrating a conditionally delayed access operation, as caused by conditional delay logic, for example, as in FIG. 2, that advantageously provides a substantially optimal pipelined latency, in accordance with certain exemplary implementations of the present invention.

Reference is now made to FIG. 4a, which is a timeline illustratively depicting an exemplary conditionally delayed CAS operation. Here, the timeline includes a clock signal, control/address bus signals, data bus signals, various related time periods, and indicators of which target core operations occur at various times. The periods shown include a tRCD, which is being enforced in this example by the delay CAS (DC) period, a row-to-row time (tRR) period, and a column latency (CL) period.

Here, a counter can be started at the first activate (ACT1) signal and two clock cycles counted to enforce the tRCD period. The core begins the activate operation upon receipt ACT1. During the DC period, an associated access (CAS) command (READ1) is received and buffered. Once the DC period has been enforced, then the READ1 operation can begin and the data will be available after the CL period. The subsequent ACT2 signal demonstrates a pipeline process can be conducted, with each new ACT signal having an enforced DC period.

Figure 4B:
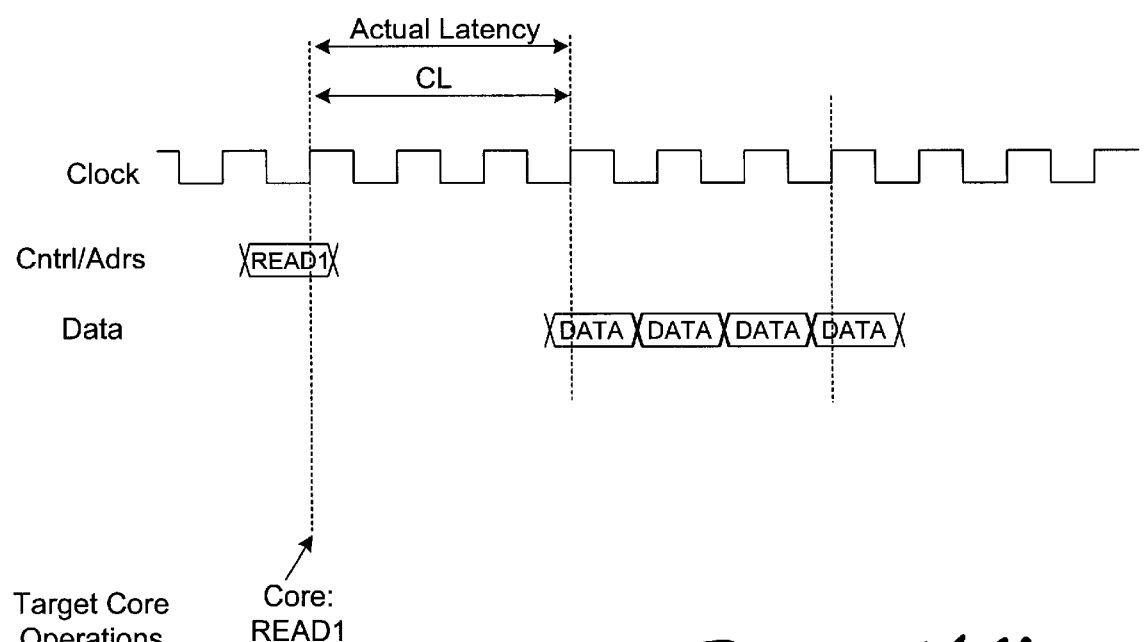
FIG. 4b is a timeline graph illustrating a conditionally delayed access operation following a page hit, in which conditional delay logic, for example, as in FIG. 2, advantageously provides a substantially minimal unloaded latency, in accordance with certain exemplary implementations of the present invention.

FIG. 4b is a similar timeline as in FIG. 4a. The difference is that in the timeline in FIG. 4b, a page hit has previously occurred (not shown) wherein the DC period (e.g., tRCD period) already ended and no subsequent activate (RAS) command has been received. Consequently, there is no need to enforce another DC period, and the actual latency will be equal to the CAS latency (CL) period. Thus, as illustrated in FIG. 4a, the conditional delay logic advantageously enforces a substantially optimal pipelined latency. As illustrated in FIG. 4b, the same conditional delay logic advantageously provides a substantially minimal unloaded latency by not enforcing additional latency.

Although some preferred implementations of the various methods and arrangements of the present invention have been illustrated in the accompanying Drawings and described in the foregoing Detailed Description, it will be understood that the invention is not limited to the exemplary implementations disclosed, but is capable of numerous rearrangements, modifications and substitutions without departing from the spirit of the invention as set forth and defined by the following claims.

What is claimed is:

1. A method for use in a memory circuit, the method comprising:
   receiving a row activate command followed by at least one column access command, the row activate command being associated with a requested row activate operation and the column access command being associated with a requested column access operation;
   measuring a defined delay period beginning with the performance of the row activate operation; and
   delaying the performance of the column access operation until the defined delay period has ended if the corresponding column access command is received during the defined delay period.

2. The method as recited in claim 1, further comprising:
   performing the column access operation without significant delay, if the column access command is received after the defined delay period has ended and prior to receipt of a subsequent row activate command.

3. The method as recited in claim 2, further comprising programmably defining the defined delay period.

4. The method as recited in claim 3, wherein programmably defining the defined delay period further includes providing a delay register with a delay value that defines a number of clock signal events associated with the defined delay period, and wherein measuring the defined delay period further includes identifying when the number of clock signal events defined in the delay value have occurred.

5. The method as recited in claim 4, wherein the clock signal events are clock signal cycles.

6. The method as recited in claim 2, wherein the delay period is based on a row-to-column delay value.

7. The method as recited in claim 1, wherein the column access command is associated with a read operation.

8. The method as recited in claim 1, wherein the column access command is associated with a write operation.

9. An apparatus comprising:
   means for receiving a row activate command associated with a requested row activate operation,
   means for receiving, subsequent to receiving the row activate command, at least one column access command associated with a requested column access operation;
   means for measuring a defined delay period beginning with the performance of the requested row activate operation; and
   means for selectively additively delaying the performance of the requested column access operation until the defined period has ended if the corresponding column access command is received during the defined delay period.

10. The apparatus as recited in claim 9, further comprising;
    means for performing the requested column access operation without additive delay, if the column access command is received after the defined delay period has ended and prior to receipt of a subsequent row activate command, then.

11. The apparatus as recited in claim 10, further comprising:
    means for programmably defining the defined delay period.

12. The apparatus as recited in claim 11, wherein the means for programmably defining the defined delay period further includes means for storing a delay value that defines a number of clock signal events associated with the defined delay period, and wherein the means for measuring the defined delay period further includes means for selectively identifying when the number of clock signal events defined in the delay value have occurred in a given clock signal.

13. The apparatus as recited in claim 12, wherein the clock signal events are clock signal cycles.

14. The apparatus as recited in claim 10, wherein the delay period is based on a row-to-column delay value.

15. The apparatus as recited in claim 10, wherein the column access command is associated with a read operation.

16. The apparatus as recited in claim 10, wherein the column access command is associated with a write operation.

17. A memory device that includes a memory core having a plurality of memory cells therein, sense amplification circuitry coupled to the memory core and operatively configured to selectively access the memory cells, and interface circuitry coupled to the sense amplification circuitry and operatively configured to receive externally generated memory operation requests and in response perform corresponding memory operations, the apparatus comprising:

conditional delay logic coupled to the interface circuitry and the sense amplification circuitry, and operatively configured to measure a defined delay period from the start of a row activate memory operation, and delay a subsequent column access memory operation until the defined period has ended if a corresponding column access memory operation request is received during the defined delay period.

18. The memory device as recited in claim 17, wherein the conditional delay logic is further configured to perform the column access memory operation if the column access memory operation request is received after the defined delay period has ended and prior to receipt of a subsequent row activate memory operation request, then.

19. The memory device as recited in claim 18, wherein the conditional delay logic further includes:

a programmable delay value register operatively configured to store a delay value that defines a number of clock signal events associated with the defined delay period;

delaying logic coupled to the programmable delay value register and operatively configured to identify when the number of clock signal events defined in the delay value have occurred in a clock signal; and decision logic coupled to the delaying logic and operatively configured to queue the subsequent column access memory operation until the delaying logic identifies when the number of clock signal events have occurred.

20. The memory device as recited in claim 19, wherein the clock signal events are clock signal cycles.

21. The memory device as recited in claim 19, wherein the delay value is based on a row-to-column delay value.

22. The memory device as recited in claim 19, wherein the delaying logic includes a counter.

23. The memory device as recited in claim 18, wherein the conditional delay logic is provided within the interface circuitry.

24. The memory device as recited in claim 23, wherein the interface circuitry is operatively configured to support synchronous memory operations.

25. The memory device as recited in claim 18, wherein the column access memory operation is associated with a read operation.

26. The memory device as recited in claim 18, wherein the column access memory operation is associated with a write operation.

27. A system comprising:

a bus;

a memory controller coupled to the bus and configured to output memory operation requests to the bus and conduct corresponding memory operations via the bus; and at least one memory device coupled to the bus, the memory device comprising:

a memory core having a plurality of memory cells therein, sense amplification circuitry coupled to the memory core and operatively configured to selectively access the memory cells, interface circuitry coupled to the sense amplification circuitry and the bus, and operatively configured to receive the memory operation requests from the bus and in response perform corresponding memory operations, the interface circuitry including conditional delay logic coupled to the sense amplification circuitry and operatively configured to measure a defined delay period from the start of a row activate memory operation and delay a subsequent column access memory operation until the defined delay period has ended if a corresponding column access memory operation request is received during the defined delay period.

28. The system as recited in claim 27, wherein the interface circuitry is further configured to perform the column access memory operation if the column access memory operation request is received after the defined delay period has ended and prior to receipt of a subsequent row activate memory operation request.

29. The system as recited in claim 28, wherein the conditional delay logic further includes:

a programmable delay value register operatively configured to store a delay value that is representative of a number of clock signal events associated with the defined delay period;

delaying logic coupled to the programmable delay value register and operatively configured to identify when the number of clock signal events defined in the delay value have occurred in an inputted clock signal; and decision logic coupled to the delaying logic and operatively configured to queue the subsequent column access memory operation until the delaying logic identifies when the number of clock signal events have occurred.

30. The system as recited in claim 29, wherein the memory controller is further configured to program the programmable delay value register with the delay value.

31. The system as recited in claim 29, wherein the memory controller further includes delay tracking logic that is operatively configured to measure the defined delay period and determine when data associated with the memory operation request should be available on the bus.

32. The system as recited in claim 28, wherein the column access memory operation is associated with a read operation.

33. The system as recited in claim 28, wherein the column access memory operation is associated with a write operation.

34. A memory controller configurable to be coupled to a bus and to output memory operation requests to the bus and conduct corresponding memory operations via the bus with a memory module coupled to the bus, the memory controller comprising:

delay tracking logic that is operatively configured to measure a defined delay period and determine when data associated with the memory operation request should be available on the bus.

35. A memory controller configurable to be coupled to a bus and to output memory operation requests to the bus and conduct corresponding memory operations via the bus with a memory module coupled to the bus, the memory controller comprising:

delay tracking logic that is operatively configured to measure a defined delay period and determine when data associated with the memory operation request should be available on the bus; and delay value storage logic configured to output a delay value establishing the defined delay period from the start of a row activate memory operation to the start of a subsequent column access memory operation.

36. The memory controller as recited in claim 35, wherein the delay period is based on a row-to-column delay value associated with the memory device, and the delay value generating logic is further configured to read the row-to-column delay value over the bus from the memory module.

37. The memory controller as recited in claim 35, wherein the column access memory operation is associated with a read operation.

38. The memory controller as recited in claim 35, wherein the column access memory operation is associated with a write operation.

* * * * *